United States Patent [19]

Chen

[11] Patent Number: 5,436,188

[45] Date of Patent: Jul. 25, 1995

[54] DRAM CELL PROCESS HAVING ELK HORN SHAPED CAPACITOR

[75] Inventor: Chung-Zen Chen, Taipei, Taiwan

[73] Assignee: Industrial Technology Research Institute, Hsinchu, Taiwan

[21] Appl. No.: 233,766

[22] Filed: Apr. 26, 1994

[51] Int. Cl.⁶ .................................. H01L 21/8242
[52] U.S. Cl. ................................ 437/52; 437/47; 437/60; 437/919
[58] Field of Search ................ 437/47, 48, 52, 60, 437/919; 257/306, 307, 308

[56] References Cited

U.S. PATENT DOCUMENTS

| | | | |
|---|---|---|---|
| 5,102,820 | 4/1992 | Chiba | 437/52 |
| 5,145,801 | 9/1992 | Chhabra | 437/47 |
| 5,240,871 | 8/1993 | Doan et al. | 437/47 |
| 5,288,655 | 2/1994 | Higasitani | 437/60 |
| 5,290,726 | 3/1994 | Kim | 437/60 |
| 5,330,928 | 7/1994 | Tseng | 437/60 |

FOREIGN PATENT DOCUMENTS 0174767  7/1991  Japan ........................... 437/52

Primary Examiner—Tom Thomas
Attorney, Agent, or Firm—George O. Saile

[57] ABSTRACT

A new method for fabricating a microminiature capacitor, on a DRAM, having an increased electrode area was accomplished. The method involves utilizing the capacitor node contact opening in a relatively thick silicon oxide for making both the self-aligned contact and the bottom electrode of the capacitor. The bottom electrode is formed from a single continuous polysilicon layer that forms a conformable coating on the bottom and sides of the contact opening. The side walls of the contact opening are further etched to form curved or serpentine shaped sidewalls that enhance the area of the bottom capacitor electrode when the polysilicon layer is deposited.

28 Claims, 5 Drawing Sheets

DRAM CELL PROCESS HAVING ELK HORN SHAPED CAPACITOR

RELATED PATENT APPLICATION

Ser. No. 08/233,768 filed Apr. 26, 1994 entitled DRAM CELL FABRICATION by same inventor.

BACKGROUND OF THE INVENTION

(1) Field of the Invention

The present invention relates to the fabrication of a dynamic random access memory (DRAMs) device, and more particularly, a fabrication technique for making microminiaturized storage capacitor used for charge storage.

(2) Description of the Prior Art

Very large scale integration (VLSI) technologies have greatly increased the circuit density on the chip, and have significantly improved the circuit performance and reduced the cost of todays electronic products. Further improvement in the performance to cost ratio depends strongly on continued down scaling of these devices on a VLSI chip. One type of VLSI chip, the dynamic random access memory (DRAMs), is used extensively in the electronic industry and particularly in the computer industry for electrical data storage. These DRAM chips consist of an array of individual cells which store a unit of data (bit) and contain one charge passing transistor, usually a metal-oxide-semiconductor field effect transistor (MOSFET) and a single storage capacitor. In the next 5 to 10 years the number of these cells are expected to reach 256 megabits per chip. To achieve these advances in data storage and maintain a reasonable chip size, the individual cells, on the chip, must be significantly reduced in size.

As these individual memory cells decrease in size, so must the MOSFET charge passing transistor and the storage capacitor decrease in size. However, the reduction in the storage capacitor size makes it difficult to store sufficient charge on the capacitor to maintain an acceptable signal-to-noise level. These smaller storage capacitor also, require shorter refresh cycle times to retain the necessary charge level.

To avoid these problems, others have proposed forming stacked capacitor structures which rely on using self-aligning technique, See, for example, A. Chiba U.S. Pat. No,. 5,102,820. The object of many of these technique is to have the capacitor electrode extend upward and to fold back upon itself, so as to increase the capacitor electrode area without increasing the cell area. These vertical structures, in many cases, rely on forming side walls using etch back techniques to interconnect the various layers. Although these technique are important in semiconductor technologies, it would be preferable to form such vertical structure out of a single continuous layer.

SUMMARY OF THE INVENTION

It is an object of the present invention to provide a storage capacitor whose capacitor node contact is self-aligned to the contact of the device on the substrate. For example, to the source or drain of the a field effect transistor.

It is another object of this invention to increase the area of the capacitor by fabricating vertical sidewalls on the capacitor perimeter, without increasing the surface area of the DRAM cell.

It is still another object of this invention to further increase the capacitor electrode area by forming a vertical extending wall having a serpentine shape and formed from a single continuous conducting layer.

BRIEF DESCRIPTION OF THE DRAWINGS

The object and other advantages of this invention are best explained in the preferred embodiment with reference to the attached drawing that include.

DESCRIPTION OF THE PREFERRED EMBODIMENTS

Now in keeping with the objects of the invention, the method for forming the storage capacitor with a self-aligned contact, is covered in detail. This capacitor can be fabricated on MOSFET structures that are currently used in the manufacture of DRAMs. Therefore, only those details of the underlying structure will be described that are necessary for understanding the current invention.

Figure 1:
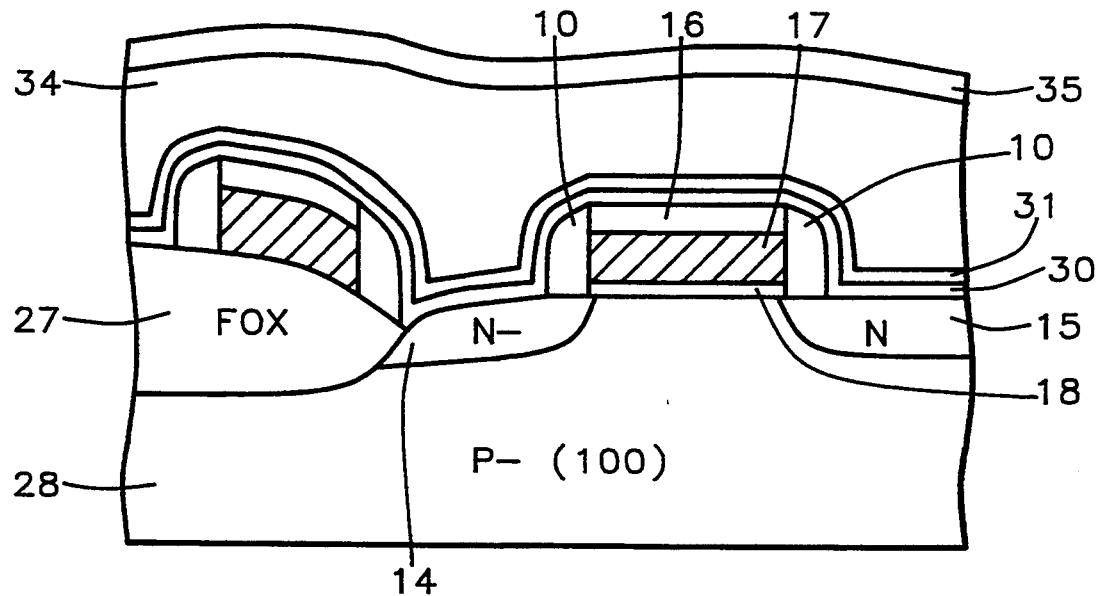
FIGS. 1-8 illustrate schematically the cross-section representation of a DRAM cell having a charge storage capacitor and a MOSFET as the charge passing switch. The figures follow the process flow in the preferred embodiment for making the self aligning capacitor contact and bottom capacitor electrode with a vertical wall having a serpentine profile.

Referring now to FIG. 1, a cross-sectional view of the substrate 28, with a MOSFET transistor built on its surface, is shown schematically. The preferred substrate is composed of a P type single crystal silicon with a <100> crystallographic orientation. A thick Field OXide 27 (FOX), for isolating the device, is first formed surrounding the region where the device is to be built. Briefly, the method commonly practiced in the industry is to use a thin thermal oxide (pad oxide) and a silicon nitride layer as an oxidation resistant mask. The desired field oxide regions are etched open in the oxide/nitride layer using conventional photolithographic techniques and a field oxide is then thermally grown, typically to a thickness of about 4500 to 5500 Angstroms.

The semiconductor devices are then fabricated on the silicon surface in the non-oxidize areas, after removing the silicon nitride layer using a wet etch. For example, etching in a heated solution of phosphoric acid ($H_3PO_4$) at a temperature of about 150° C. For the DRAM cell, the typical transistor used is a MOSFET and is now briefly described. The silicon surface is first carefully cleaned and a good quality thermal oxide is grown to form the gate oxide 18. The preferred thickness is about 80 to 200 Angstroms. Next,the gate polysilicon structure is formed by first depositing a polysilicon layer 17, for example, using a low pressure chemical vapor deposition (LPCVD). The thickness of this layer is usually in the range from 1000 to 4000 angstroms. After the gate polysilicon is appropriately doped, a silicon dioxide layer 16 is then deposited on the polysilicon. The the gate structure is then formed by anisotropic etching in a low pressure plasma etcher using an appropriate gas mixture. Conventional photolithographic technique are used for defining the etch mask.

The next step is to form the lightly doped source/drain 14, 15 of the N-channel MOSFET. This doping is usually accomplished by implanting a N-type species, such as arsenic or phosphorous. For example, a typical implant might consist of a phosphorous $P^{31}$ at a dose of between 1 to 10 E 13 atoms/cm$^2$ and with an energy of 30 to 80 Kev. As is known to one skilled in the art, a photolithographic mask can be used to avoid implanting in areas not requiring the implant.

After forming the lightly doped source/drain, side wall spacers 10 are formed on the gate structure. These spacers are formed by depositing a blanket layer of low temperature silicon oxide on the substrate and using an anisotropic etch to etch back to the source/drain surface. For example, the silicon oxide can be deposited by chemical vapor deposition using tetraethoxysilane (TEOS) at a temperature in the range of between about 650° to 900° C., and the etch back can be accomplished with a reactive plasma etcher of various design and using an appropriate gases mixture. For example, the etching can be performed in a gas mixture of carbon tetrafluoride and hydrogen ($CF_4/H_2$).

The remainder of this embodiment relates more specifically to the object of this invention which is the formation of the storage capacitor having a vertical wall with a serpentine shape and a self-aligned contact.

Referring still to FIG. 1, the capacitor structure is fabricated by depositing a first insulating layer 30 of silicon dioxide followed by depositing a second insulating layer 31 composed of silicon nitride. The preferred process for the silicon oxide layer is a deposition in a low pressure chemical vapor deposition (LPCVD) process reactor using tetraethoxysilane (TEOS), at a preferred temperature range of between about 700° to 750° C. and having a preferred thickness in the range from 300 to 800 Angstroms. The process of choice for the silicon nitride is a plasma enhanced chemical vapor deposition (PECVD) technique having a temperature range of between about 300° to 400° C. and a preferred thickness in a range of between about 300 to 800 Angstroms.

Shown next in FIG. 1, a third insulating layer of borophosphosilicate glass (BPSG) 34, having a low flow temperature, is deposited. The preferred thickness range, for this layer, is between about 5000 to 7000 Angstroms. The BPSG layer 34 is then thermally anneal at a temperature of between about 850° to 900° C. for approximately 30 minutes to effectively planarize the surface. An alternate approach is to use rapid thermal annealing at an elevated temperature of about 1000° C. for a time of about 30 seconds. After planarizing the BPSG, a fourth insulating layer 35 is, deposited. For example, by chemical vapor deposition (CVD) of silicon dioxide using TEOS and a deposition temperature in the range of about 700° to 750° C. The preferred thickness of layer 35 being in the range of between about 800 to 1000 Angstroms.

Figure 2:
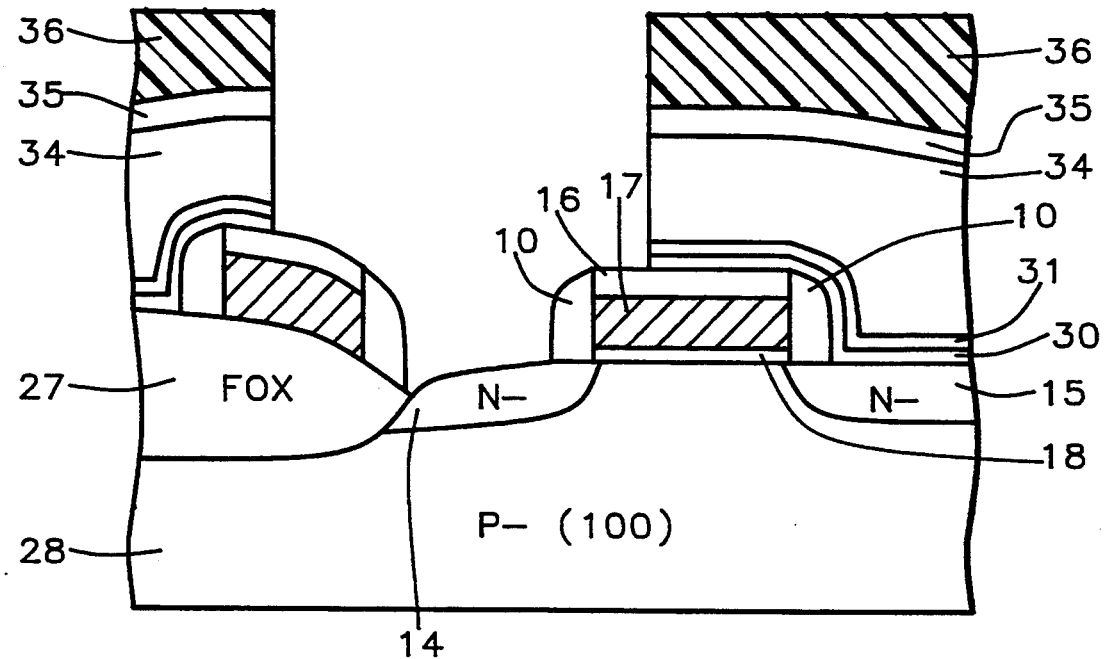

Referring now to FIG. 2, the sequence of steps are shown for defining the capacitor region and forming the opening for both the self-aligned capacitor node contact and the bottom capacitor electrode, using a first photoresist layer 36 and masking step. First, the planar surface is coated with a photoresist 36. For example, a PFI26A9 type photoresist manufactured by Sumitomo Chemical Corp. of Japan can be used. Then a conventional photolithographic process is used to define the contact openings. The silicon dioxide layer 35 and BPSG layer 34 are then etched using an anisotropic etch process. For example, a reactive plasma etcher using a gas mixture of trifluoromethane ($CHF_3$) and carbon tetrafluoride ($CF_4$) can be used at a process pressure of about 300 mTorr. The underlying silicon nitride 31 provides the etch stop for the BPSG etching, as shown in FIG. 1. The preferred etch rate selectivity for BPSG to silicon nitride ($Si_3N_4$) should be greater than about 10 to 1. The silicon nitride layer 31 is then removed in the contact area using a phosphoric acid ($H_3PO_4$) wet etch at a temperature of about 150° C. The bottom TEOS layer 30 is then etched in a plasma etcher to expose the substrate surface in the node contact area, as shown in FIG. 2. The thick field oxide and the gate sidewalls are used to self-align the node contact to the source/drain 14 of the MOSFET, also shown in FIG. 2.

Figure 3:
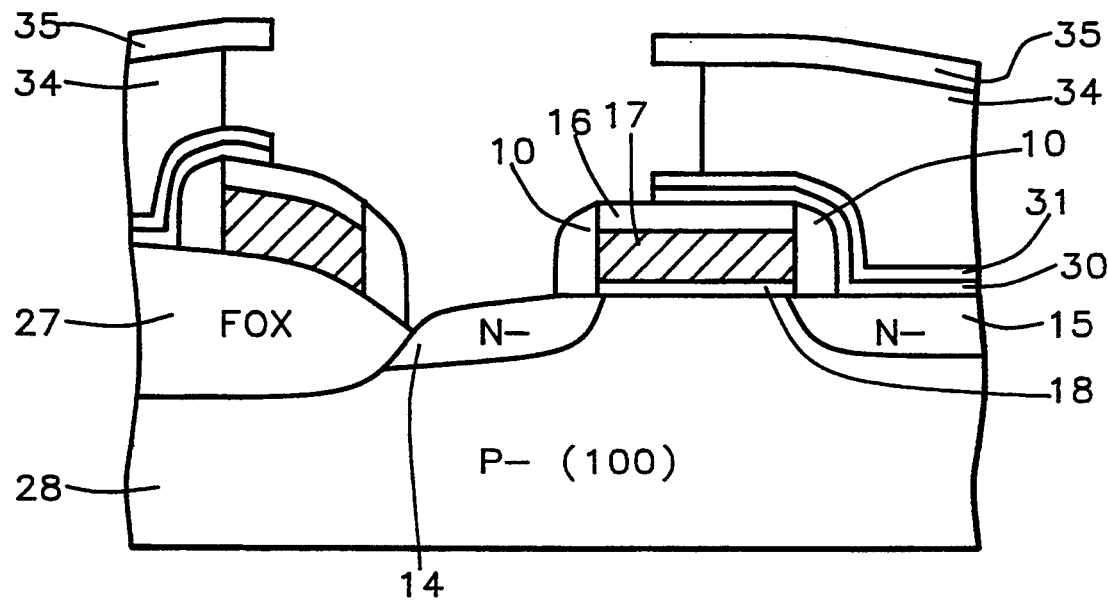

Referring next to FIG. 3, the BPSG layer 34 is selectively etched laterally, in the contact opening, to undercut the CVD silicon oxide (TEOS) layer 35 and thereby, increase the wall area for the bottom electrode. The preferred etching method is a low pressure vapor etch in hydrofluoric acid (HF) and $H_2O$ vapor. The preferred vapor pressure being in the range of between about 500 to 600 Pascal with the preferred partial pressure of $H_2O$ being in the range of about 100 to 200 Pascal. These process parameters result in an etch selectivity of BPSG to the TEOS glass layer 35 greater than 1000 to 1. Alternatively, the BPSG layer 34 can be etched first to form the lateral recess and then the silicon nitride layer 31 and the silicon oxide layer 30 can be etched to form the self-aligned contact. The photoresist layer is then removed, preparing the substrate for the next step, in which the bottom electrode of the storage capacitor is formed.

Figure 4:
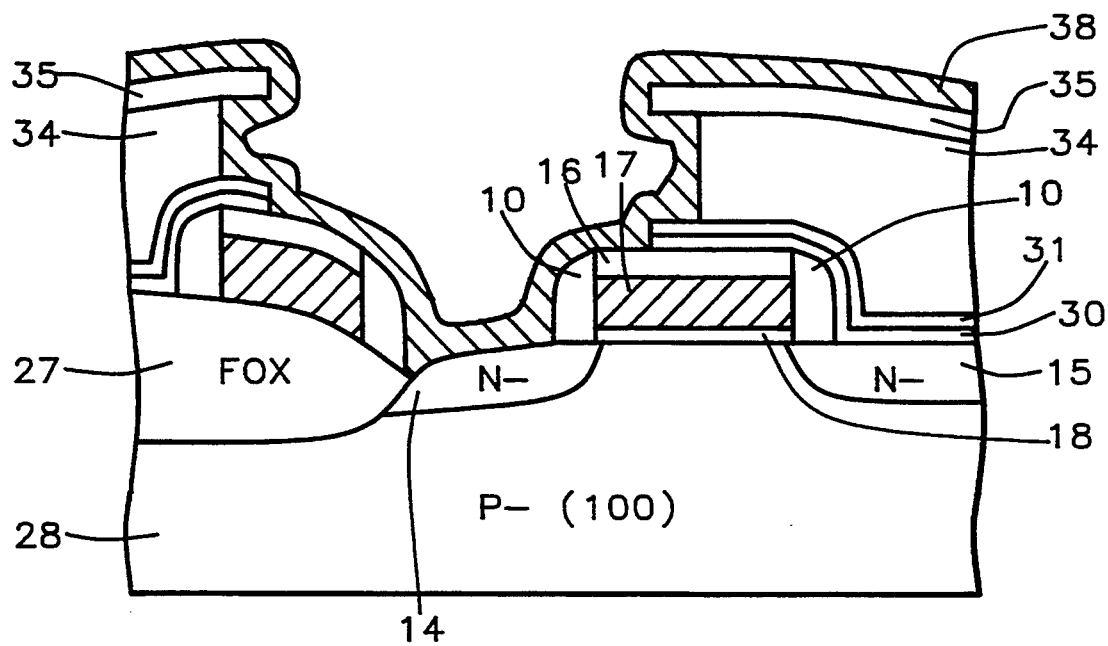

Now referring to FIG. 4, the bottom electrode is formed by depositing a first polysilicon layer 38 which conformably coats the recessed side of the contact opening. The preferred deposition process for the first polysilicon layer 38 is a low pressure chemical vapor deposition (LPCVD) having a preferred thickness of between about 500 to 1000 Angstroms, and a process temperature in the ranges from about 550° to 600° C. The dopant level in the node contact is then achieved by introducing a N type impurity into the first polysilicon layer 38, either by implanting or in situ doping. A thermal cycle is used later in the process to drive in the dopant and form the ohmic contact. The preferred dopant type is an N-type impurity, such as phosphorous, and having a preferred implantation dose in the polysilicon of about 5 E 15 atoms/cm$^2$.

Figure 5:
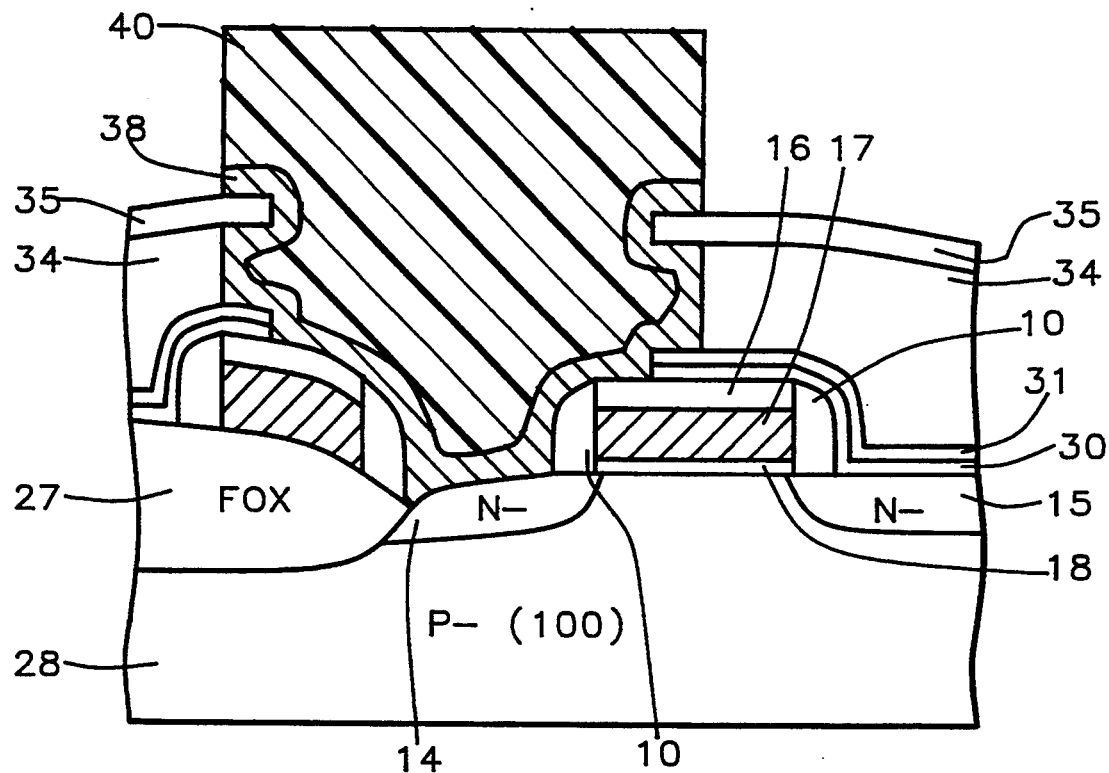

Next, as shown in FIG. 5, a second photoresist layer 40 is deposited and conventional photolithographic techniques and etching are used to define the bottom capacitor region over the contact opening. The photoresist image is made larger than the opening to allow for alignment tolerances. An anisotropic etch is used to selectively remove the first polysilicon layer 38 to the surface of the fourth insulating layer 35, defining and isolating the bottom capacitor electrode. The preferred etching being done in a reactive plasma etching. The remaining photoresist is then removed by conventional means.

Figure 6:
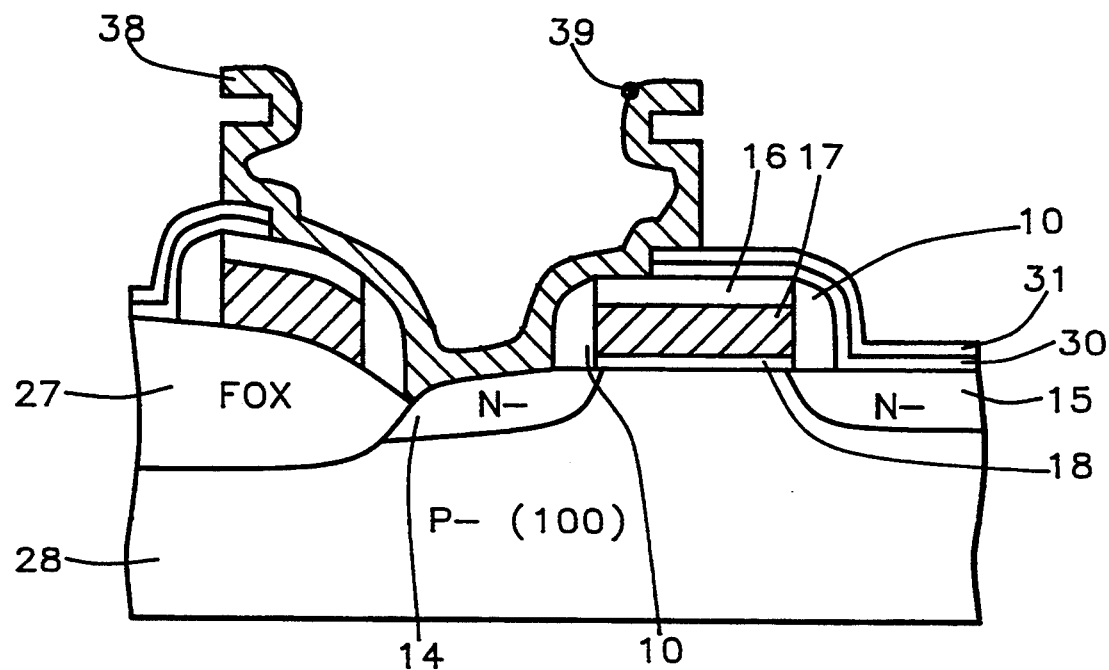

Now referring to FIG. 6, the next step is to completely remove the fourth insulating 35 (CVD silicon dioxide) and the third insulating layer 34 (BPSG) using a conventional wet etch process, such as BHF (buffered hydrofluoric acid), completely exposing the bottom capacitor electrode. The polysilicon layer 38 acts as the etch stop in the contact node area and the silicon nitride layer 31 serves as the etch stop out side the node contact area.

Also, since the capacitor plate extends vertically upward at the perimeter, as shown in the FIG. 6, it is clear that the capacitor area can be increased further by increasing the thickness of the BPSG layer 34 without increasing the area on the substrate required for the capacitor. The polysilicon surface of this bottom electrode can be further increased in effective area, by using techniques to roughen the surface. See for example, H. C. Tuan et al U.S. Pat. No. 5,266,514.

Still referring to FIG. 6, the bottom electrode which is now free of the BPSG layer, is ready to be thermally oxidized and optionally processed to receive other high dielectric constant films. This dielectric layer 39, depicted as the surface of layer 38, should preferably be as thin as possible and have the highest dielectric constant possible. However, practical limitation at present limit films to thickness in the range of 30 to 250 Angstroms. Composite films of silicon oxide/silicon nitride/silicon oxides (ONO) is currently preferred over a single layer of silicon oxide because of it improved properties. For example, the nitride has a much higher dielectric constant (6–9) and the composite is less prone to having pin holes, which can cause inter electrode shorts.

Figure 7:
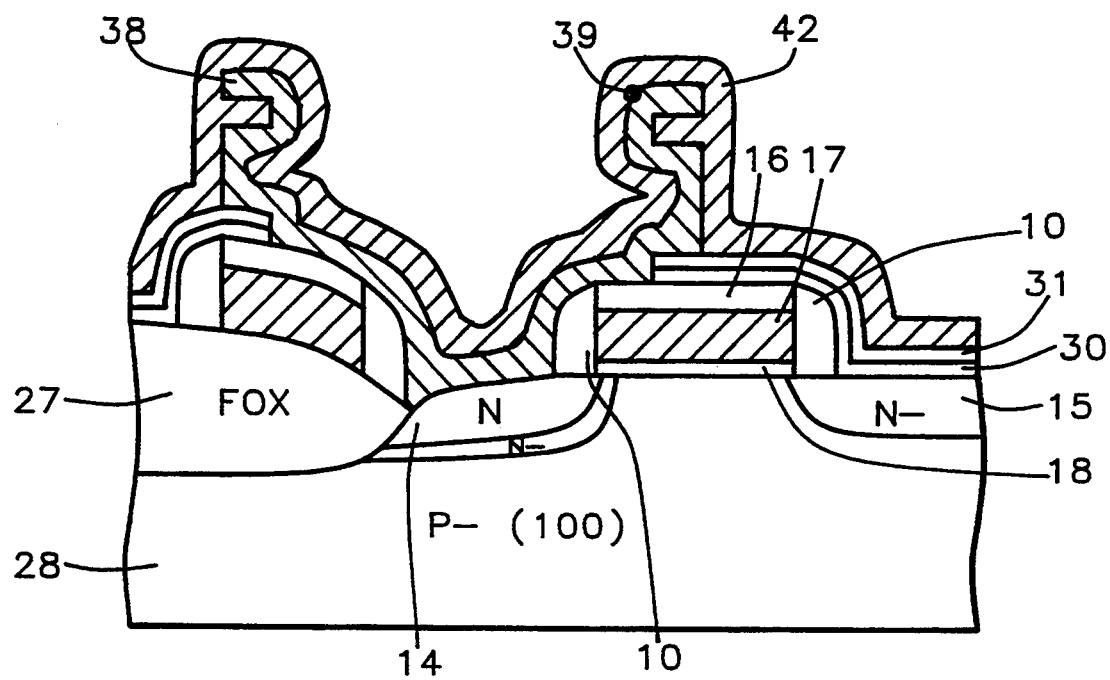
Figure 8:
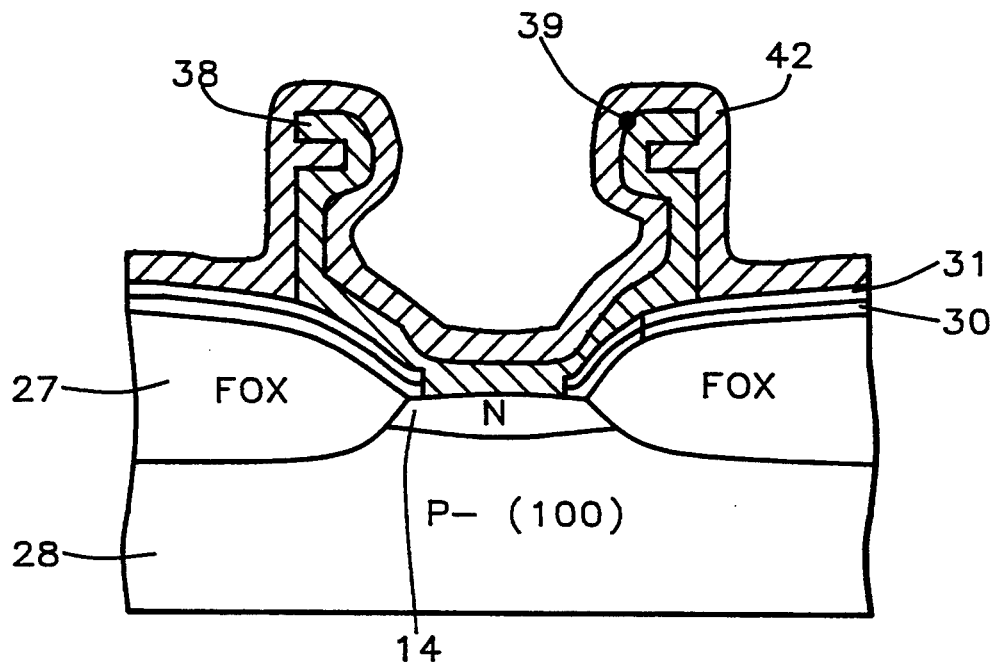
Figure 9:
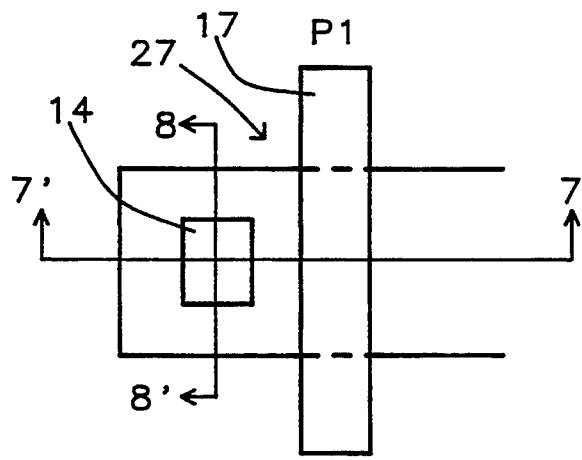
FIG. 9 is an elevational view of the FIG. 7 structure and FIG. 8 structure showing the MOSFET polysilicon gate and the node contact with the surrounding field oxide ( FOX).

As shown in FIG. 7, a second polysilicon layer 42, is deposited over the thin dielectric layer 39 to form the top electrode and complete the stacked capacitor structure. This second polysilicon layer is also doped with N type dopant, such as phosphorous, and the preferred concentration is in the range of between about 5 E 19 to 2 E 20 atoms/cm$^3$. FIG. 8 is a cross-sectional view of FIG. 7 at 90 degrees, showing the capacitor node contact. FIG. 9 is an elevational view of FIG. 7 showing the node contact 14, the MOSFET gate electrode 17 and the surrounding field oxide 27 over which the stacked capacitor is formed.

Figure 10:
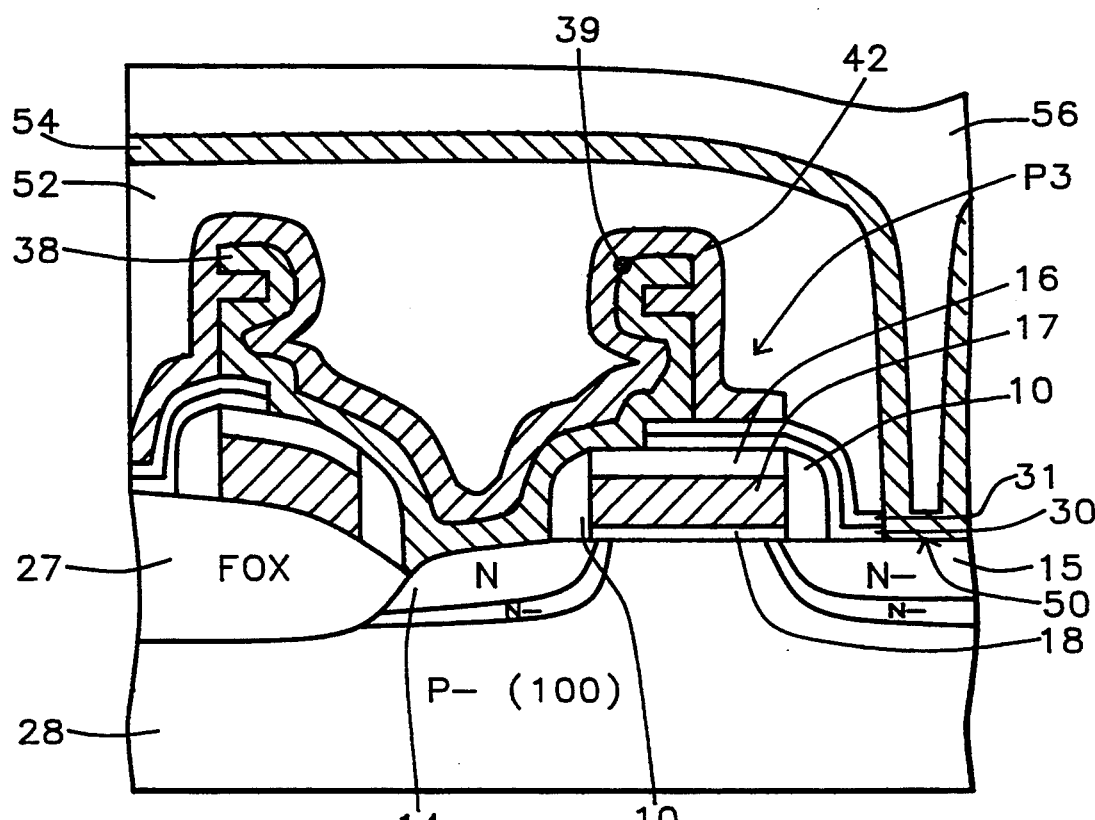
FIG. 10 shows the completed cell structure up to the polysilicon or silicide bit line and the over laying insulation. As the title implies, the cross sectional shape of the completed storage capacitor resembles an elk's horn.

Now referring to FIG. 10, the schematic shows a cross-sectional view of a completed DRAM structure. The second polysilicon layer 42 of the storage capacitor is opened over the bit line contact 50. Next a fifth insulating layer 52, for example, a BPSG layer that supports the bit line wiring, is deposited to a preferred thickness of between about 3500 to 5000 Angstroms. The bit line contact mask and an appropriate photolithographic process are used to open the bit line contact in the BPSG insulation layer 52, the silicon nitride layer 31 and the TEOS deposited layer 30. A third polysilicon layer 54 is deposited to form the bit line metallurgy. This polysilicon layer 54 is deposited and doped N type, for example, by implanting with arsenic or phosphorous ion. The substrate is then annealed to drive in the N type dopant to form the appropriate ohmic contact in the bit line contact 50. Next, a silicide layer is formed on the bit line polysilicon layer 54 to increase its conductivity. The preferred method is the deposition of a metal layer followed by a low temperature alloying sinter. The preferred silicide being tungsten silicide (WSi). The tungsten silicide (WSi) bit line wiring is now patterned using a photolithographic technique and a reactive ion etching process. A sixth insulating layer 56, for example, composed of BPSG, is deposited and anneal at elevated temperature to planarize the surface and complete the DRAM cell structure.

While the invention has been particularly shown and described with reference to the preferred embodiments thereof, it will be understood by those skilled in the art that various changes in form and detail may be made without departing from the spirit and scope of the invention.

What is claimed is:

1. A method for fabricating a capacitor on a semiconductor substrate having a device region formed therein comprising the steps of:
    providing said semiconductor substrate with field effect transistors in said device region having source/drain areas;
    depositing a first insulating layer on said substrate;
    depositing a second insulating layer on said first insulating layer forming a diffusion barrier and etch stop layer on said substrate; and
    depositing a third insulating layer with a low flow temperature on said second insulating layer and planarizing by thermal annealing said third insulating layer;
    depositing a fourth insulating layer having a significantly lower etch rate than said third insulating layer;
    forming openings through said fourth, third, second and first insulating layers to said device region in said substrate surface using a patterned first photo resist layer, said openings extending to said source/drain area and further overlapping the gate electrode of said field effect transistors;
    etching laterally said third insulating layer in said opening using a highly selective low pressure hydrofluoric acid vapor etch and removing said first photo resist layer to expose said fourth insulating layer over recessed third insulating layer;
    depositing a first polysilicon layer over said substrate and said openings to thereby form the bottom capacitor electrode having a serpentine vertical wall structure and making electrical contact to said source/drain area in said device region;
    depositing a second photoresist layer and lithographically forming patterned areas over said opening; and
    etching anisotropically said first polysilicon layer to said fourth insulating layers to complete and isolate said bottom capacitor electrode;
    removing remaining said second photo resist layer and etching remaining said fourth layer and said third layer to expose completely said bottom electrode;
    forming dielectric layer on surfaces of said isolated bottom capacitor electrode; and
    depositing a second polysilicon layer on said first dielectric layer, and on said second insulating layer elsewhere forming a top capacitor electrode and completing said capacitor having a self-aligned contact to said source/drain area.

2. The method of claim 1, wherein said first insulating layer is composed of silicon dioxide formed from chemical vapor deposition in tetraethoxysilane (TEOS) and having a thickness from about 300 to 800 Angstroms.

3. The method of claim 1, wherein said second insulating layer is composed of silicon nitride having a thickness range from about 300 to 800 Angstroms.

4. The method of claim 1, wherein said third insulating layer is a low flow temperature glass composed of a borophosphosilicate glass (BPSG) having a thickness in the range of about 5000 to 7000 Angstroms.

5. The method of claim 4, wherein said third insulating layer is planarized by thermal annealing in the temperature range of about 850° to 900° C. for a time of about 30 minutes.

6. The method of claim 1, wherein said fourth insulating layer is composed of silicon dioxide formed from chemical vapor deposition in tetraethoxysilane (TEOS) and having a thickness from about 800 to 1000 Angstroms.

7. The method of claim 1, wherein said third insulating layer is recessed under said fourth layer by said laterally etching using a low pressure hydrofluoric acid/$H_2O$ vapor etch having an etch rate selectivity of said third insulating layer to said fourth insulating layer greater than 1000.

8. The method of claim 7, wherein said low pressure hydrofluoric/$H_2O$ vapor etch is performed at a pressure in the range of about 500 to 600 Pascal and a $H_2O$ partial pressure of about 20 percent.

9. The method of claim 1, wherein said bottom capacitor electrode composed of said first polysilicon layer is doped N type by implanting or by in situ doping having a concentration of between 5 E 19 to 2 E 20 atoms/$cm^3$ and having a thickness range from between about 500 to 1000 Angstroms.

10. The method of claim 1, wherein said isotropic etching of said fourth insulating layer and said third insulating layer is performed in a buffered hydrofluoric acid having a concentration of about 0.5 to 1.0 percent.

11. The method of claim 1, wherein said dielectric layer is a composite silicon oxide/silicon nitride/silicon oxide (ONO) having a thickness in the range from about 30 to 250 Angstroms.

12. The method of claim I wherein said top capacitor electrode layer composed of said second polysilicon layer is doped N-type by implanting or in situ doped in the concentration range from about 5 E 19 to 2 E 20 atoms/$cm^3$ and having a thickness in the range from about 800 to 1000 Angstroms.

13. The method of claim I wherein said bottom capacitor electrode is formed completely from a single polysilicon layer and has a vertical serpentine wall components which increases capacitance.

14. The method of claim 1 wherein said device regions is a source/drain region and said capacitor is a part of a DRAM cell.

15. A method for fabricating a DRAM cell with a Field Effect Transistor (FET) having a device source/drain area and a capacitor formed on and in a semiconductor substrate therein comprising the steps of forming said capacitor:

providing said semiconductor substrate with field effect transistors in said device regions having source/drain areas;

depositing a first insulating layer on said substrate;

depositing a second insulating layer on said first insulating layer forming a diffusion barrier and etch stop layer on said substrate; and depositing a third insulating layer with a low flow temperature on said second insulating layer and planarizing said third insulating layer;

depositing a fourth insulating layer over side third insulating layer having a significantly lower etch rate than said third insulating layer;

forming openings through said fourth, third, second and first insulating layers to said FET device source/drain contact regions using a patterned first photo resist layer, said openings extending to said source/drain areas and further overlapping the gate electrodes of said field effect transistors;

etching laterally said third insulating layer in said opening using a highly selective low pressure hydrofluoric acid vapor etch and removing said first photo resist layer exposing said fourth insulating layer over recessed third insulating layer depositing a first polysilicon layer over said substrate and said openings to thereby form the bottom capacitor electrode having a serpentine vertical wall structure and making electrical contact to said FET device source/drain region therein;

depositing a second photo resist layer and lithographically forming patterned areas over said opening; and etching anisotropically said first polysilicon layer to said fourth insulating layers to complete and isolate said bottom capacitor electrode making contact to said FET source/drain region therein;

removing remaining said second photoresist layer and etching isotropically said fourth and third insulating layer to expose completely said bottom electrode;

forming dielectric layer on surfaces of said isolated bottom capacitor electrode; and depositing a second polysilicon layer on said first dielectric layer, and on said second insulating layer elsewhere forming a top capacitor electrode and completing said capacitor having a self-aligned contact to said source/drain area.

16. The method of claim 15, wherein said first insulating layer is composed of silicon dioxide formed from chemical vapor deposition in tetraethoxysilane (TEOS) and having a thickness from about 300 to 800 Angstroms.

17. The method of claim 15, wherein said second insulating layer is composed of silicon nitride having a thickness range from about 300 to 800 Angstroms.

18. The method of claim 15, wherein said third insulating layer is a low flow temperature glass composed of a borophosphosilicate glass (BPSG) having a thickness in the range of about 5000 to 7000 Angstroms.

19. The method of claim 18 wherein; said third insulating layer is planarized by thermal annealing in the temperature range of about 850° to 900° C. for a time of about 30 minutes.

20. The method of claim 15, wherein said fourth insulating layer is composed of silicon dioxide formed from chemical vapor deposition in tetraethoxysilane (TEOS) and having a thickness from about 800 to 1000 Angstroms.

21. The method of claim 15, wherein said third insulating layer is recessed under said fourth insulating layer using a low pressure hydrofluoric acid $H_2O$ vapor etch, said third insulating layer having an etch rate selectivity to said fourth insulating layer greater than 1000.

22. The method of claim 21, wherein said low pressure hydrofluoric/$H_2O$ vapor etch is performed at pressure in the range of about 500 to 600 Pascal and a $H_2O$ partial pressure of about 20 percent.

23. The method of claim 15, wherein said bottom capacitor electrode composed of said first polysilicon layer is doped N type by implanting or by in situ doping having a concentration of between 5 E 19 to 2 E 20 atoms/$cm^3$ and having a thickness range from between about 500 to 1000 Angstroms.

24. The method of claim 15, wherein said isotropic etching of said fourth and third insulating layer is performed in a buffered hydrofluoric acid having a concentration of about 0.5 to 1.0 percent.

25. The method of claim 15, wherein said dielectric layer is a composite silicon oxide/silicon nitride/silicon oxide (ONO) having a thickness in the range from about 30 to 250 Angstroms.

26. The method of claim 15 wherein said top capacitor electrode layer composed of said second polysilicon layer is doped N-type by implanting or in situ doped in the concentration range from about 5 E 19 to 2 E 20 atoms/cm$^3$ and having a thickness in the range from about 800 to 1000 Angstroms.

27. The method of claim 15; wherein said bottom capacitor electrode is formed completely from a single polysilicon layer and has a vertical serpentine wall components which increases capacitance.

28. The method of claim 15 wherein said device regions is a source/drain region and said capacitor is a part of a DRAM cell.

* * * * *